(12) United States Patent
Krasner

(10) Patent No.: US 6,633,255 B2
(45) Date of Patent: Oct. 14, 2003

(54) METHOD FOR OPEN LOOP TRACKING GPS SIGNALS

(75) Inventor: Norman F. Krasner, San Carlos, CA (US)

(73) Assignee: Qualcomm Inc., San Diego, CA (US)

(*) Notice: Subject to any disclaimer, the term of this patent is extended or adjusted under 35 U.S.C. 154(b) by 0 days.

(21) Appl. No.: 10/029,357

(22) Filed: Oct. 22, 2001

(65) Prior Publication Data

US 2002/0084933 A1 Jul. 4, 2002

Related U.S. Application Data

(63) Continuation-in-part of application No. 09/558,692, filed on Apr. 25, 2000, now Pat. No. 6,400,314, which is a continuation of application No. 09/129,599, filed on Aug. 5, 1998, now Pat. No. 6,064,336, which is a division of application No. 08/759,523, filed on Dec. 4, 1996, now Pat. No. 5,841,396, which is a continuation-in-part of application No. 08/612,582, filed on Mar. 8, 1996, now Pat. No. 5,874,914
(60) Provisional application No. 60/005,318, filed on Oct. 9, 1995.

(51) Int. Cl.[7] .............................................. H04B 7/185
(52) U.S. Cl. ................... 342/357.12; 701/213; 375/147
(58) Field of Search .................... 342/357.12; 701/213; 375/147

(56) References Cited

U.S. PATENT DOCUMENTS 5,459,473 A * 10/1995 Dempster et al. ........... 342/357

* cited by examiner

*Primary Examiner*—Theodore M. Blum
(74) *Attorney, Agent, or Firm*—Bruce W. Greenhalls; Charles Brown; Philip Wadsworth

(57) ABSTRACT

Method and apparatuses for receiving and tracking satellite signals in a highly sensitive and accurate receiver. In one aspect of the invention an exemplary method includes generating a set of at least three indicators based on processing a portion of a satellite positioning system signal received by a receiver and computing a measurement of a parameter from an interpolation of the set of indicators. Each of the indicators corresponds to a different predetermined hypothesized value of the parameter and is indicative of a probability, or likelihood, that the parameter of the signal is equal to that corresponding value.

22 Claims, 18 Drawing Sheets

METHOD FOR OPEN LOOP TRACKING GPS SIGNALS

RELATED APPLICATIONS

This application is a continuation-in-part of U.S. patent application Ser. No. 09/558,692, filed on Apr. 25, 2000 now U.S. Pat. No. 6,400,314, which is a continuation of U.S. patent application Ser. No. 09/129,599, filed Aug. 5, 1998 now U.S. Pat. No. 6,064,336, which is a division of U.S. patent application Ser. No. 08/759,523, Dec. 4, 1996 now U.S. Pat. No. 5,841,396, which is a continuation-in-part of U.S. patent application Ser. No. 08/612,582, Mar. 8, 1996 now U.S. Pat. No. 5,874,914 by Norman F. Krasner.

This application is also related to and hereby claims the benefit of the filing date of a provisional patent application by the same inventor, Norman F. Krasner, which application is entitled Low Power, Sensitive Pseudorange Measurement Apparatus and Method for Global Positioning Satellites Systems, Ser. No. 60/005,318, filed Oct. 9, 1995.

FIELD OF THE INVENTION

The present invention relates to the field of global positioning systems, and more particularly to a method and apparatus for receiving and tracking satellite signals in a highly sensitive and accurate receiver.

BACKGROUND OF THE INVENTION

A conventional Global Positioning System (GPS) receiver acquires, tracks, and demodulates the synchronized signals transmitted from a multiplicity of GPS satellites in order to compute the position of the receiver.

Each GPS satellite transmits a direct sequence spread spectrum signal, which is modulated by a repeated code represented by a sequence of binary phase states, called chips. A specific sequence of chips corresponding to a code is called a pseudorandom or pseudonoise (PN) sequence. Each GPS satellite broadcasts a signal with a unique code, i.e., a unique PN sequence. The codes available for civilian applications in the U.S., called C/A codes, are from a family known as Gold codes. A C/A code consists of 1023 chips in a frame period of one millisecond (msec). Thus, a code is repeated in a GPS signal every one millisecond.

In addition, a 50-baud Binary Phase Shift Keyed (BPSK) data is superimposed on the pseudonoise sequence. The bit boundaries of the BPSK data are aligned with the beginning of PN sequences so that there are 20 complete PN sequences in each data bit period (i.e., 20 msec). The BPSK data contains ephemeris data, which specifies the position of the satellite and clock timing of the GPS signal.

Thus, an ideal received GPS signal, without any additive noise and interference, is in the form:

$$s(t) = AP(t-\tau)d(t-\tau)\cos[2\pi f_0(t-\tau) + \theta_r] \quad (1)$$

where A is the amplitude of the signal; P(t), which has value +1 or −1, is the pseudonoise modulation at time t; d(t) is the BPSK data, which also has value either +1 or −1; $f_0$ is the nominal carrier frequency in Hertz; $\theta_r$ is the phase angle, which may slowly vary due to Doppler effects, phase noises, etc.; and $\tau$ is the delay to be estimated by the receiver. In practice, the amplitude A typically varies slowly with time. The fact that time variable t may stretch or contract with time due to Doppler effects may be incorporated into the quantities $f_0$, $\tau$ and $\theta_r$.

A primary task of a GPS receiver is to measure the parameters $\tau$, $f_0$, and $\theta_r$ of the received GPS signals transmitted from a multiplicity of GPS satellites in order to compute the position of the receiver. The measuring of the parameter $\tau$ is typically performed on a continuing basis using a circuit called a "PN Tracking Circuit". As part of this measurement process, the carrier frequency $f_0$ and the residual phase angle $\theta_r$ are measured and compensated for in a circuit called a "Carrier Tracking Circuit". Conventionally, the PN and Carrier Tracking circuits take the form of feedback circuits, called closed tracking loops.

In general, conventional tracking loops utilize feedback circuitry that attempts to produce a locally generated reference signal that replicates the received signal, i.e., to align the reference signal with the received signal. FIG. 1 shows a block diagram of a closed loop tracking method according to one embodiment of the prior art. The signal discriminator 510 generates a correction signal, which indicates how to correct the reference signal 514. The correction signal is fed back on line 515 to reduce the difference between the received signal and the reference signal. Since this is done in a continuing manner, the procedure may be viewed as an iterative, or "closed loop", type of method.

For example, in a PN tracking loop circuit, a local PN generator replicates the PN sequence in a received GPS signal. The locally generated PN sequence is compared in this circuit to a PN sequence in the received GPS signal to produce an output whose magnitude corresponds to the degree of synchronization between the local reference sequence and the received sequence. When the two sequences are synchronized, the amplitude of the output reaches a maximum; when the two sequences drift apart, the amplitude of the output decreases. Thus, the change of the amplitude of the output is used to adjust the timing of the local PN generator to increase the amplitude of the subsequent output. This is a servo or feedback type of technique. Similar techniques are also used to track the phase and the frequency of the carrier of the GPS signal.

Closed loop tracking works well when the parameters of the received GPS signal, such as amplitude and delay, vary slowly in time, in which case long term averaging of the parameters of a GPS signal can be performed. However, there are many situations in which the parameters of the signal change rapidly in an unpredictable manner. For example, when a GPS receiver is moving inside a building, the received signal fluctuates rapidly in amplitude, delay, and carrier due to the unpredictable superposition of the direct signal and the reflected signals, emanating from walls, large objects, etc. Similarly, when a GPS receiver is operated in city environments with large buildings, so-called "urban canyons", the signal level may fluctuate rapidly if the GPS receiver is moving rapidly, such as when the receiver and its antenna is moving with an automobile. Again, the culprit is the unpredictable interference between the direct signal and the reflected signals. Often there is no direct signal from the GPS satellite, and all received are reflected signals. This situation further exacerbates the speed and the degree of the fluctuation in the parameters of the received signal.

A closed tracking loop performs poorly when the received GPS signal fluctuates rapidly. In a closed loop tracking system, a prior measurement of a parameter p of the received signal and a correction signal, which is typically related to an estimated error in the prior measurement (or measurements), are used to produce a current measurement of the parameter, i.e., $$\hat{p}(n+1) = h(\hat{p}(n), e(n)) \quad (2)$$

where $\hat{p}(n)$ is the measurement of the parameter p at time n; e(n) is an estimated error of the prior measurement, and h is a linear or nonlinear function. Typically, an increment of n may correspond to one or more PN frame periods.

In some formulations the argument of the function h contains a multiplicity of prior measurements, p̂(n),p̂(n−1), p̂(n−1), . . . , and/or errors e(n), e(n−1), e(n−2), . . . . However, for simplicity and for illustrative purposes we utilize the simplified formulation of (2).

Also, many authors refer to the measurements of the parameter p as "estimates" since the measurement process includes noise that limits the precision of such measurements. In this invention the term "measurement", when referring to a parameter, is synonymous with estimate of the parameter.

To illustrate the characteristics of a closed tracking loop, consider a linear form of equation (2), i.e., $$\hat{p}(n+1)=\hat{p}(n)+ke(n) \qquad (3)$$

where k is a constant or a slowly varying parameter. If the error e(n) is expressed as e(n)=p(n)−p̂(n), where p(n) is the exact value of the parameter p at time n, equation (3) can be rewritten as $$\hat{p}(n+1)=(1-k)\hat{p}(n)+kp(n) \qquad (4)$$

which is essentially a single pole filter type response with a time constant 1/k. Thus, an initial error in p̂ is reduced by a factor of approximately exp(−1)≈0.37 in a period equal to 1/k iterations.

In a system with k close to, but less than, unity, only the most recent measurements contribute to the corrections; hence the measurements may follow the rapid changes in the received signal. However, the system performs poorly when the received signal is weak, since there is little averaging of prior measurements. On the other hand, in a system with a small k, many prior measurements contribute to corrections and hence the system performs well, even when the received signal is weak. However, when the received signal is weak, the system performs poorly when this signal changes rapidly.

Therefore, closed tracking loops have inevitable limitations. When the parameters of the received signal change so rapidly that a closed tracking loop fails to follow the change rapidly enough to produce an accurate result, a "loop loss-of-lock" situation occurs. A "wide" loop with a strong (k near unity) correction signal may follow the rapid change of the received signal, but performs poorly when the signal is weak, since the loop is not able to distinguish received noise and interference from the desired signal. On the other hand, a "narrow" (small k) loop with a weak correction signal may often not be able to follow a rapidly changing signal.

Various approaches may be devised to make the loop design adaptable to different conditions and hence overcome some of the limitations just discussed. However, these "adaptive" approaches inevitably fail or are poor in performance when the signal dynamics and strength are sufficiently variable and unpredictable.

SUMMARY OF THE INVENTION

Methods and apparatuses for open loop tracking Global Positioning System (GPS) signals are described here.

In one aspect of the invention an exemplary method includes: (A) generating a set of at least three indicators based on processing a portion of a satellite positioning system signal received by a receiver; and (B) computing a measurement of a parameter from an interpolation of the set of indicators. Each of the indicators is indicative of a probability that a parameter of the signal (e.g., time-of-arrival of the GPS signal or carrier frequency of the GPS signal) is a predetermined value. Serial correlations, matched filtering, fast Fourier transformation, and fast convolution are among the methods used to generate these indicators.

In another aspect of the present invention, an exemplary method includes performing a de-spreading operation on a portion of a satellite positioning system signal to produce de-spread data; and performing an open-loop frequency measurement operation on the de-spread data to produce a frequency measurement of the signal. In some embodiments of the present invention, the open-loop frequency measurement operation includes: (A) performing a nonlinear operation on the de-spread data to produce first data; (B) performing a spectral analysis operation on the first data to produce spectral data; (C) and computing a frequency measurement of the signal from a location of a peak in the spectral data. In some embodiments of the present invention, the open-loop frequency measurement operation includes: (A) performing a nonlinear operation on the de-spread data to produce first data; (B) performing an averaging operation on the first data to produce averaged data; (C) computing an angle of the averaged data; and (D) computing a frequency measurement of the signal using the angle. In some embodiments of the present invention, the nonlinear operation includes a squaring operation. In some other embodiments of the present invention, the nonlinear operation includes a conjugation, delay and multiplication operation.

The present invention includes apparatuses which perform these methods, including GPS receivers which perform these methods and machine-readable media which, when executed in a GPS receiver, cause the receiver to perform these methods.

Other features of the present invention will be apparent from the accompanying drawings and from the detailed description, which follows.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
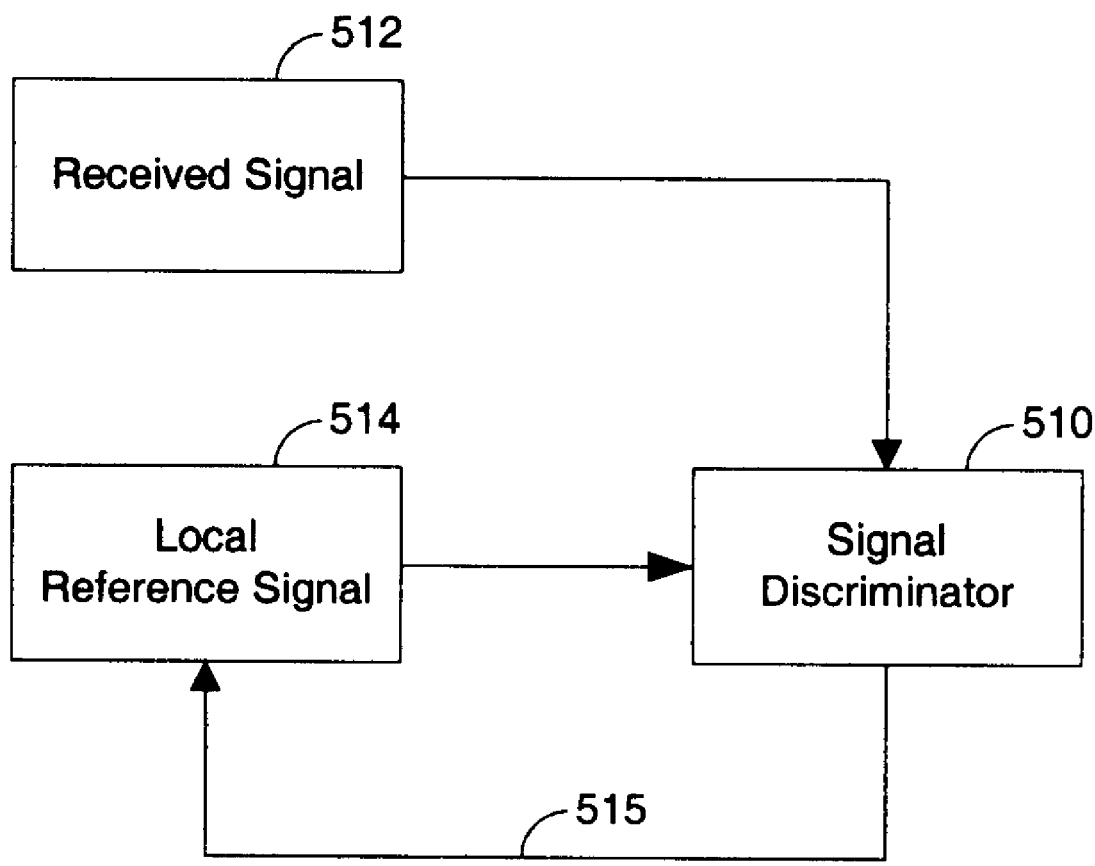
FIG. 1 shows a block diagram of a closed loop tracking method according to one embodiment of the prior art.

The subject invention will be described with reference to numerous details set forth below, and the accompanying drawings will illustrate the invention. The following description and drawings are illustrative of the invention and are not to be construed as limiting the invention. Numerous specific details are described to provide a thorough understanding of the present invention. However, in certain instances, well-known or conventional details are not described in order not to unnecessarily obscure the present invention in detail.

At least one embodiment of the present invention seeks to use open loop tracking methods to measure the parameters of GPS signals. In an open tracking loop, a measurement of a parameter p at time n+1 may be expressed as the follows.

$$\hat{p}(n+1) = f\{u_1(n+1), u_2(n+1), \ldots, u_s(n+1)\} \quad (5)$$

where $u_i(m)$ is the measurement of a quantity related to p at time m. Thus, a current measurement of p is a function of a finite number of related measurements. In equation (5), there is no explicit dependence of $\hat{p}(n+1)$ on $\hat{p}(n)$ (or $\hat{p}(n-1)$, $\hat{p}(n-2)$, etc.).

In an open loop tracking situation, prior measurements, such as $\hat{p}(n)$, $\hat{p}(n-1)$, or $\hat{p}(n-2)$, may be used to influence the calculation of subsequent measurements in a form other than that in equation (2). Typically, a prior measurement is used to provide a constrained range, or "window", within which a succeeding measurement may be taken. The location of the center of the window and/or the width of the current window are typically adjusted as a function of the prior measurement or measurements.

A number of open loop measurements may be combined to improve the accuracy of the measurements. For example, an operation of averaging together a succession of open loop measurements, or forming a median of such measurements, or fitting the measurements to some type of curve (e.g. a linear fit), etc. may be performed to obtain improved measurements. In a curve fitting process, noises and interferences can be filtered out while rapid changes of the received signal can still be followed.

In general, a GPS receiver has two operational modes, i.e., (1) an acquisition mode, and (2) a tracking mode. In an acquisition mode, a GPS receiver seeks to coarsely align to the chip level a locally generated reference PN signal with the received signal in order to detect the existence of a GPS signal and to coarsely synchronize to it. In a tracking mode, a GPS receiver seeks to precisely synchronize the reference PN signal to the GPS signal so that the timing difference between the signals is much smaller than one chip period.

In an acquisition mode, the nominal rate of the locally generated PN chips is set to be slightly different from the nominal rate of the incoming PN chips, so that the reference code "slides" relative to the received signal. A correlation process compares the two signals with one another. When the two are aligned within one chip, a large correlation output results. This causes the receiver to enter a tracking mode in which the nominal rate of the locally generated PN chips is set to that of the incoming PN chips. Often, acquisition is expedited by utilizing a multiplicity of circuits to perform correlation operations in parallel.

Figure 2:
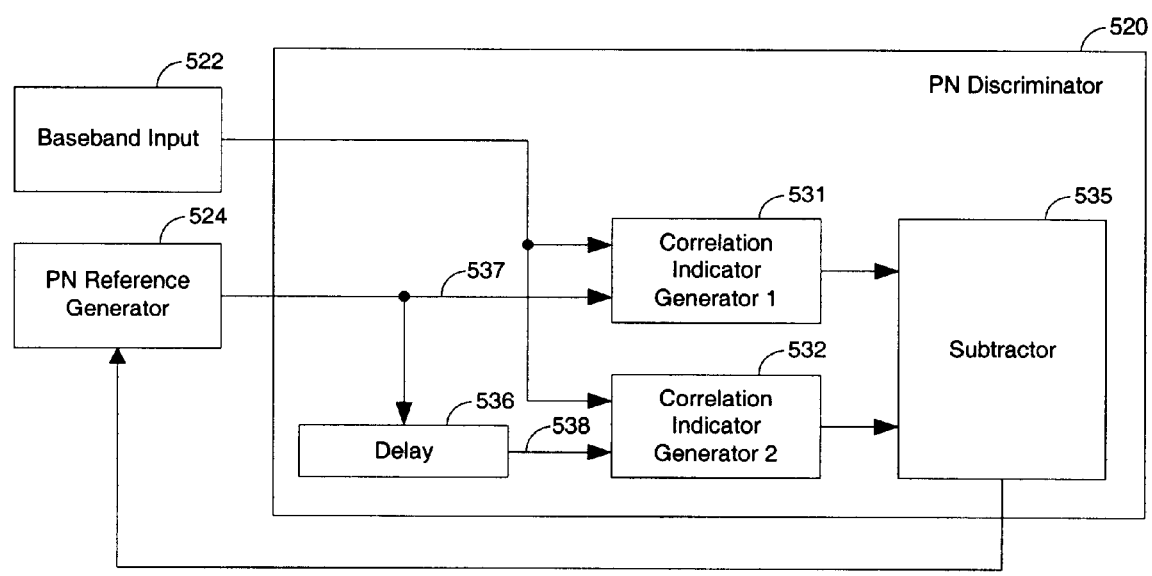
FIG. 2 shows a simplified block diagram of a closed loop pseudonoise tracking method according to one embodiment of the prior art.

FIG. 2 shows a simplified block diagram of a closed loop pseudonoise tracking method according to one embodiment of the prior art. In FIG. 2, a PN discriminator 520 compares the PN sequence in a baseband input 522, obtained from a GPS signal, with a reference PN sequence generated by a local PN reference generator 524. The PN discriminator 520 contains correlation indicator generators 531 and 532, which typically are serial correlators. A correlator is so constructed that the closer two input PN sequences are aligned, the larger an output the correlator generates. Thus, the output of a correlator is an indicator on how close the two input sequences are aligned. The result of the subtractor 535 indicates whether or not a delayed reference PN sequence on line 538 is better aligned with the PN sequence in the baseband input than is the reference PN sequence on line 537. The correction signal from the substractor 535 adjusts the timing of the reference PN sequence so that both indicator generators produce the same output. When the PN sequences on both the lines 537 and 538 are equally well aligned with the PN sequence in the baseband input, the epoch of the received PN sequence is in the middle of the epochs of the PN sequences on the lines 537 and 538.

The subtraction circuit 535 produces a correction signal, which is a signed number. The sign of this number indicates the direction (earlier or later) that the PN reference should be adjusted for better alignment. The magnitude of this difference is proportional to the current degree of misalignment.

Figure 3:
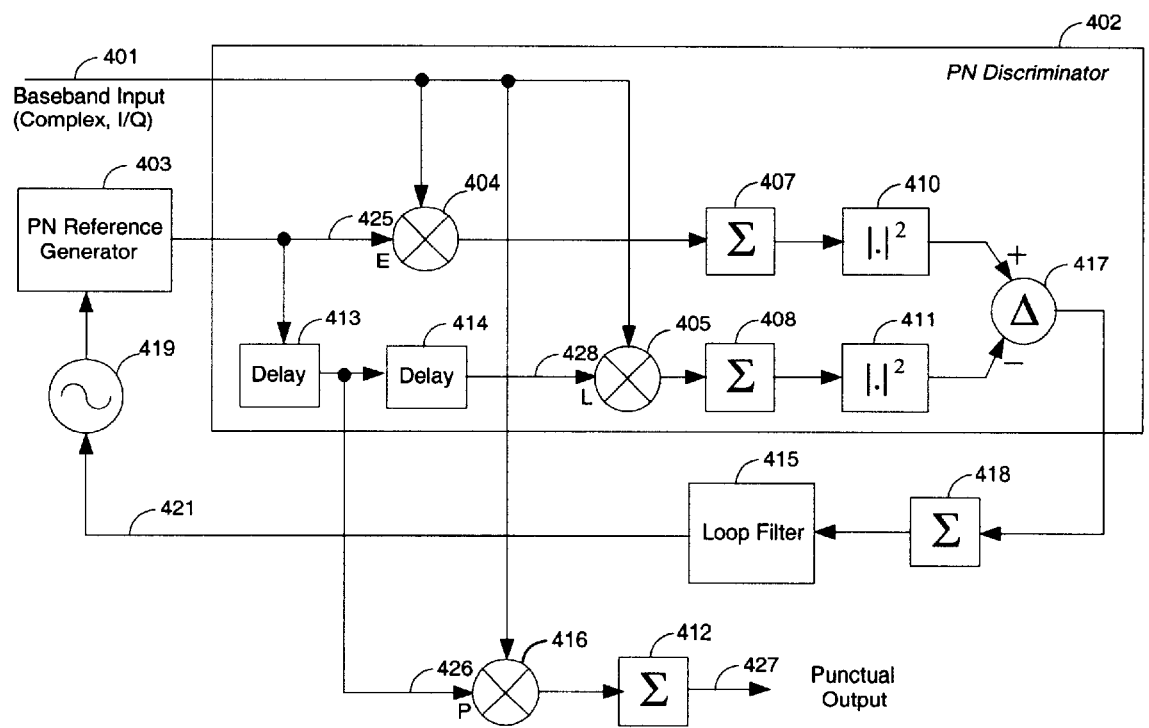
FIG. 3 shows a detailed closed loop pseudonoise tracking method according to one embodiment of the prior art.
Figure 4:
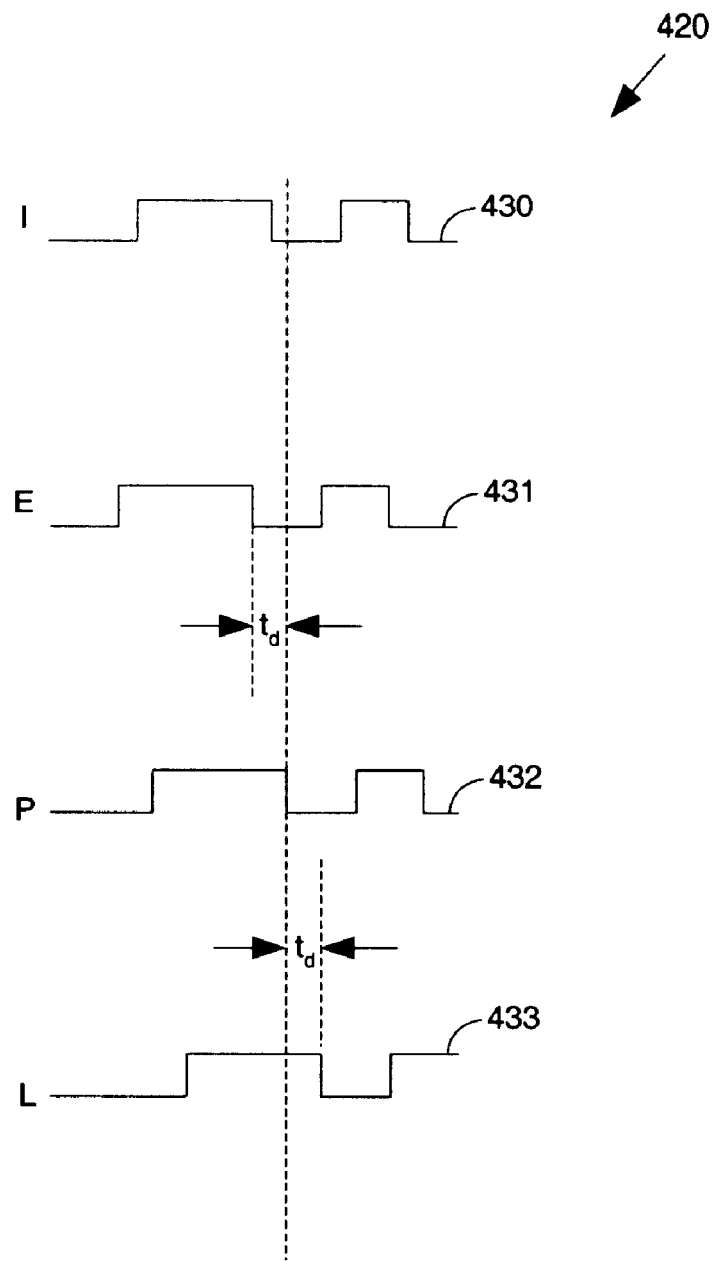
FIG. 4 illustrates waveforms for signals at various processing stages in FIG. 3.

FIG. 3 shows a detailed closed loop pseudonoise tracking method according to one embodiment of the prior art. In FIG. 3, baseband input on line 401 contains In-phase (I) and Quadrature (Q) components, which, typically, are converted from an input signal by an I/Q downconverter. Typically, the signal on line 401 has a waveform 430 as illustrated in FIG. 4. Oscillator 419 is controlled by the correction signal fed back from line 421 to align the PN sequence generated by the local generator 403 with the PN sequence in the baseband input on line 401. The basic error signal is generated by the PN Discriminator 402, which comprises two serial correlators and a subtractor 417. Each of the serial correlators performs a multiplication, an accumulation, and a nonlinear detection operation to generate a correlation output. Having a waveform 431 illustrated in FIG. 4, the Early (E) signal on line 425 is sent into the first correlator, which comprises multiplier 404, accumulator 407, and nonlinear detector 410, to generate an Early correlation output. On line 428 the Late (L) signal, as an output from delay operators 413 and 414, is sent into the second correlator, which comprises multiplier 405, accumulator 408, and nonlinear detector 411, to generate a Later correlation output. The Later signal has a waveform 433 shown in FIG. 4, which illustrates that each of the delay operators 413 and 414 causes a delay $t_d$. Thus, the epoch of the punctual signal on line 426, having a waveform 432 shown in FIG. 4, is in the middle of the epochs of the Early and the Later signals. The Later output is subtracted from the Early output by the subtractor 417 to form the basic error signal, which is further filtered by accumulator 418 and loop filter 415.

Typically, the nonlinear detectors 410 and 411 perform a magnitude or a magnitude-squared operation; accumulators 407 and 408 accumulate over a period of time that is equal to a multiplicity of PN frame periods. Accumulator 418 reduces the data rate provided to the loop filter 415 and is typically employed when the loop filter 415 is implemented by a microprocessor.

When the incoming signal is closely aligned with Early signal, the Early output is much greater than the Late output. Hence Early output minus the Late output is positive, and the positive correction signal increases the frequency of the oscillator 419. Accordingly, the clock epochs provided by the oscillator to the reference generator becomes earlier in time, i.e., move all waveforms 431, 432, 433 to the left in FIG. 4, to align the Late output more closely with the incoming signal. The opposite happens when the incoming signal is more closely aligned with the Late signal than with the Early signal. Thus, the loop reaches equilibrium when both the Early and Late signals are equally well aligned with the incoming signal, i.e., the epoch of the incoming signal is the same as that of the punctual signal, midway between those of the Early and the Late signals. Typically, in order for tracking to be maintained, the epoch of the punctual signal must be close to the epoch of the input signal (e.g., within about one chip).

When the loop reaches equilibrium, the incoming signal is aligned with the Punctual signal on line 426 of FIG. 3. The punctual output on line 427 contains the de-spread signal, i.e., the baseband signal with the pseudonoise removed. The punctual output is primarily for the retrieval of the ephemeris data that is modulated on the GPS signal (the BPSK data d of equation (1)). The phase of the oscillator 419 and the code position (or code phase) of the PN reference generator 403 are often combined to produce a measurement of time-of-arrival (or pseudorange) of the incoming signal.

Figure 5:
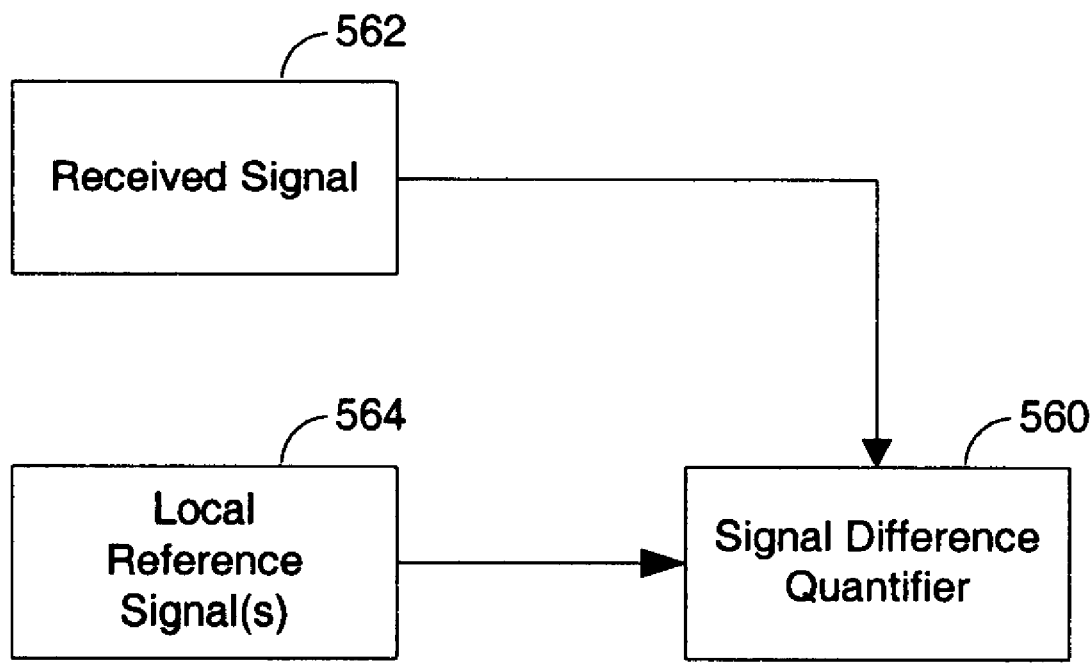
FIG. 5 shows a block diagram of an open loop tracking method according to one embodiment of the present invention.

FIG. 5 shows a block diagram of an open loop tracking method according to one embodiment of the present invention, where a signal difference quantifier 560 quantifies the difference in a parameter between that of the received signal 562 and the local reference signal 564 to determine a measurement of a parameter of the received signal. Thus, a measurement of the parameter can be obtained without the necessity of adjusting a local reference signal to have the same parameter as that of the received signal.

Figure 6:
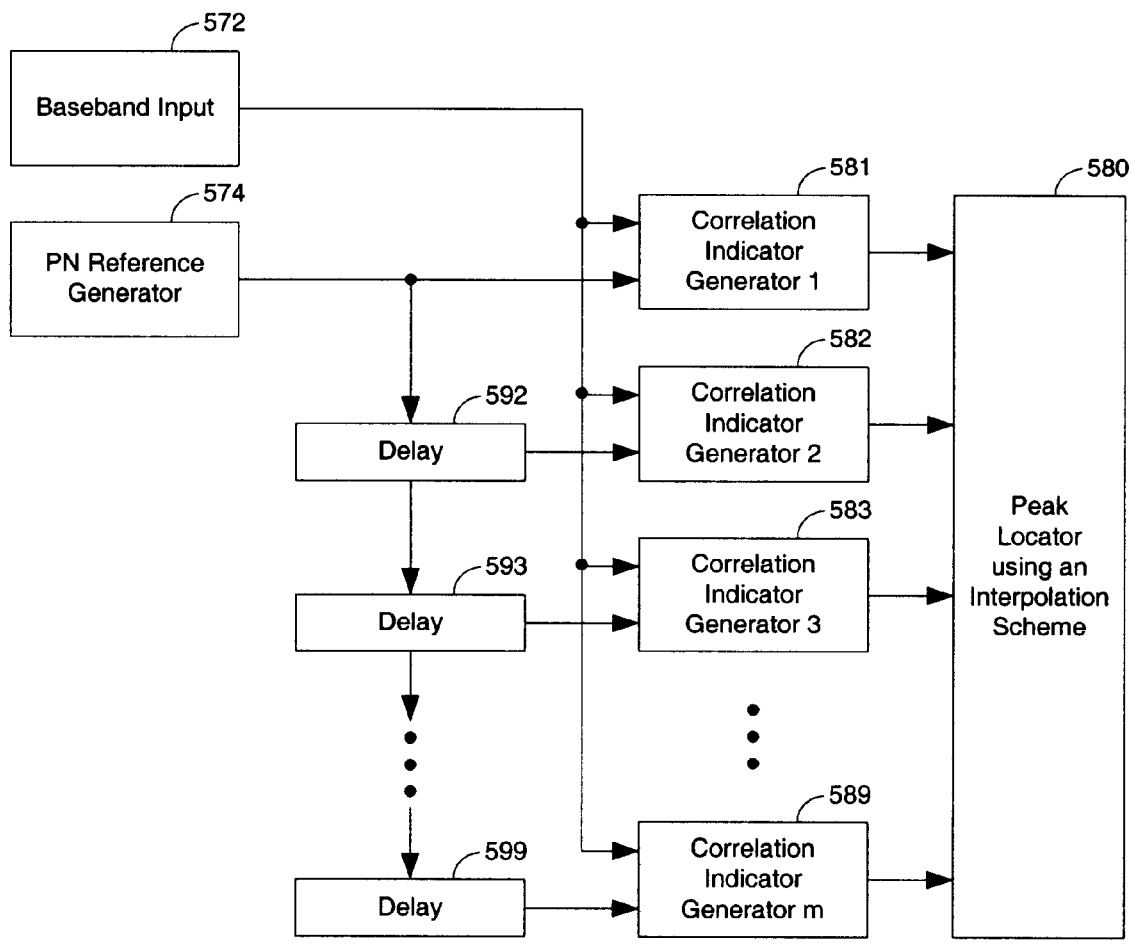
FIG. 6 shows a simplified block diagram of an open loop pseudonoise tracking method according to one embodiment of the present invention.

FIG. 6 shows a simplified block diagram of an open loop pseudonoise tracking method according to one embodiment of the present invention. The reference PN sequence, generated by the generator 574, is delayed by a set of delay operators 592, 593, . . . , 599 to create a set of reference sequences, each of which corresponds to a different epoch. This set of reference sequences is compared with the PN sequence in the baseband input 572 by a set of correlation indicator generators 581, 582, 583, . . . , 589 to generate a set of indicators. Each of the indicators is a numerical value that shows how well the corresponding delayed reference PN sequence is aligned with the PN sequence in the baseband input. Thus, each of the indicators may be viewed as indicative of the probability, or the likelihood, that the epoch of the corresponding delayed reference sequence is the epoch of the PN sequence in the received signal. The peak locator 580 uses an interpolation scheme to accurately determine the amount of delay that is required to synchronize a reference PN sequence with the PN sequence in the baseband input. Thus, the time-of-arrival is determined from the measurement of a set of correlator indicators without the necessity to iteratively synchronize a reference sequence with the incoming signal. No servo method is necessary.

Another way to view FIG. 6 is that the total delay from the reference PN generator to a given correlator indicator is proportional to the time offset between the PN reference and the input signal. Thus, this total delay represents a hypothesized value of the time-of-arrival of the input signal relative to a local time. Thus, the open loop procedure performs a set of tests that the input signal parameter is one of several hypothesized, or predetermined, values. It then provides a set of numbers, or "indicators" that this parameter equals these predetermined values. The indicators may be interpreted as probabilities or likelihoods of agreement. Based upon the value of these indicators, one may then perform an interpolation procedure as in 580 to further refine the measurement of the parameter.

Figure 7:
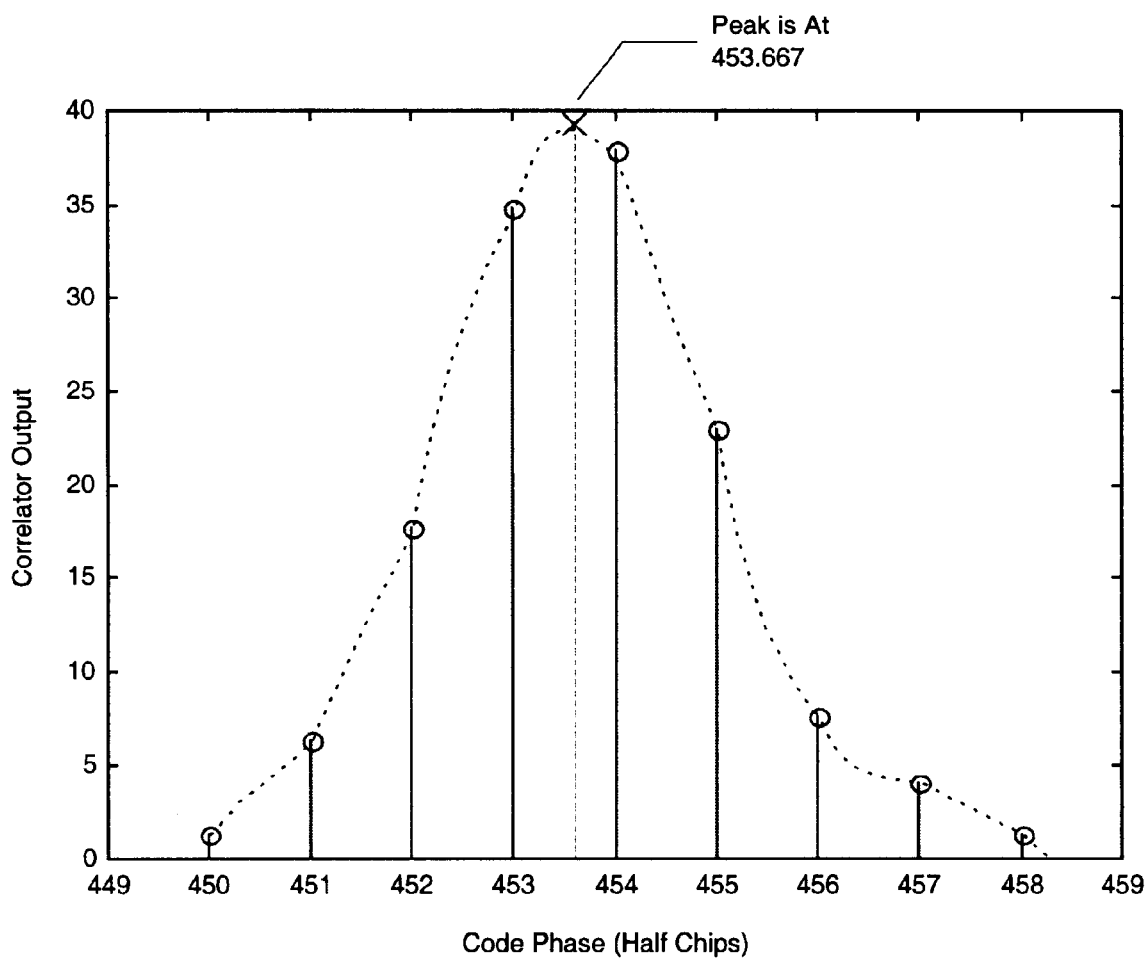
FIG. 7 illustrates an interpolation of correlation indicators.

FIG. 7 illustrates an interpolation of correlation indicators. The vertical lines at locations 450 to 458 represent the magnitude of the outputs of 9 correlation operations, where the PN epochs of consecutive correlator outputs differ from one another by one-half chip. The dotted line represents an interpolation between the values of the indicators provided by the correlators; and the "X" indicates the location of the peak found using an interpolation scheme. It will be understood that the interpolation scheme is not a trivial one in which finding the peak can be simply reduced to picking the correlation indicator with the maximum value.

Figure 8:
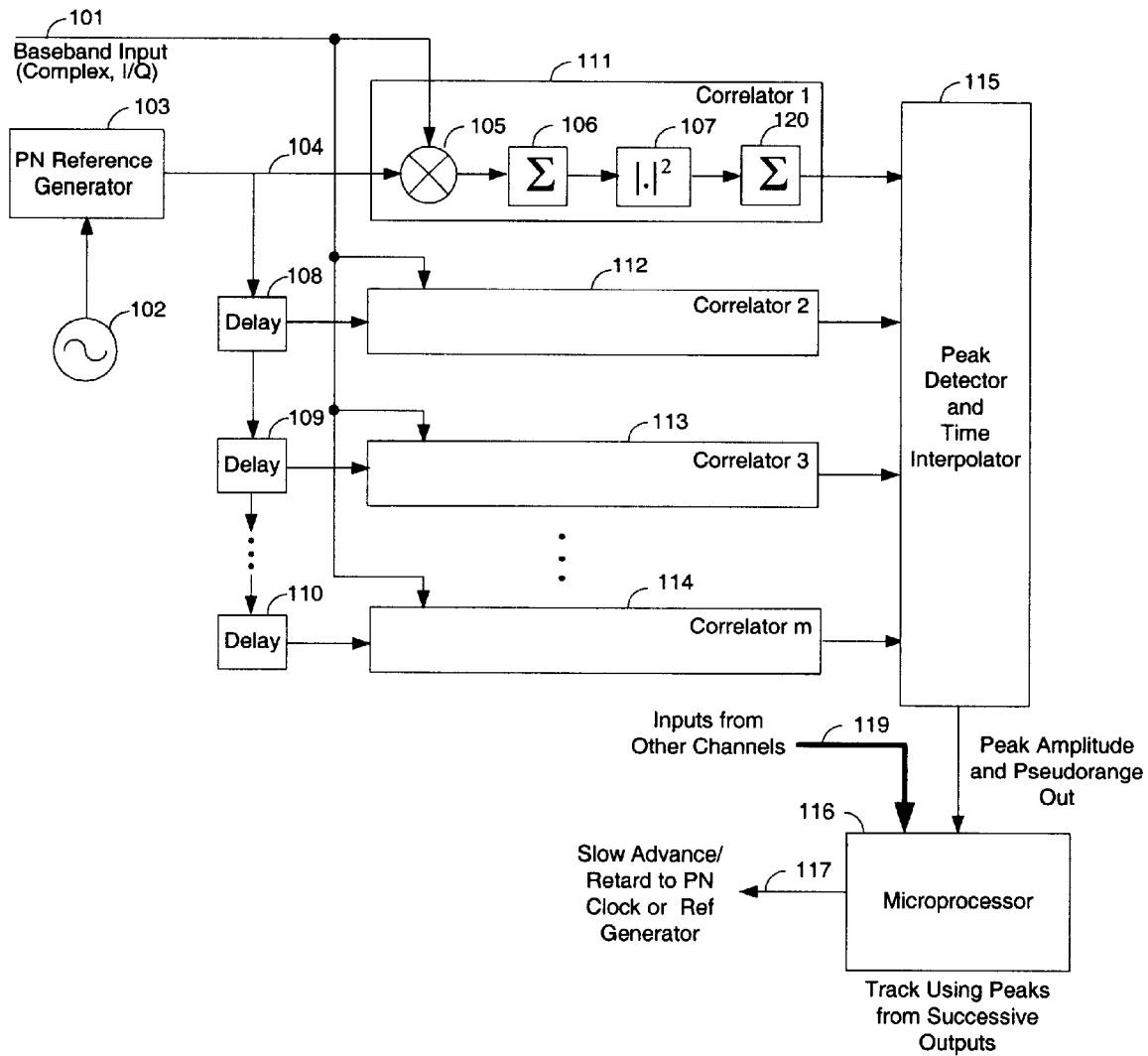
FIG. 8 shows a detailed open loop pseudonoise tracking method according to one embodiment of the present invention.

FIG. 8 shows a detailed open loop pseudonoise tracking method according to one embodiment of the present invention. It is seen that the delay operators 108, 109, . . . , 110 correspond to the delay operators 592, 593, . . . , 599 in FIG. 6; correlators 111, 112, 113, . . . , 114 correspond to the correlation indicator generators 581, 582, 583, . . . , 589 in FIG. 6. The peak detector and time interpolator 115 correspond to the peak locator 580. Correlator 111, which implements a version of a correlation indicator generator, comprises multiplier 105, accumulator 106, nonlinear detector 107, and accumulator 120. In general, other correlators (e.g., correlator 113) have the same structure as that of correlator 111.

After receiving the time information from the peak detector and time interpolator 115, the microprocessor 116 may optionally tune up the oscillator 102 so that the PN sequences in the baseband input is closely synchronized with one of the reference PN sequences. Although such feedback on line 117 may be viewed as a part of a closed loop operation, this feedback is not necessary for the accurate measurement of pseudorange, since an accurate measurement is made before such information is fed back on line 117 to adjust the timing of the oscillator. The method in FIG. 8 can also be used in an acquisition mode. Some or all the operations in 115 may be performed by microprocessor 116.

The output from the peak detector and time interpolator 115 represents the time-of-arrival for a single GPS signal from one satellite. The circuitry 101–115 may be considered as a single "channel" assigned to process this signal. Input from other channels assigned to other GPS signals (typically 8 to 12 channels) may be simultaneously provided to the microprocessor 116 in order to determine a measurement of the position of the receiver. Normally, simultaneous measurements of times-of-arrival from at least three GPS satellites are required to determine position in two dimensions (four signals are required for a three-dimensional position fix).

Successive measurements of the position of the receiver, found using an open loop tracking method according to the present invention, can be combined using various averaging or tracking algorithms to obtain improved position measurements as a function of time. Many algorithms, including least-mean-square (LMS) filtering and Kalman filtering (a form of LMS filtering), can be used to combine successive measurements. When the received signal is very weak, other algorithms may be more appropriate, such as median filtering type algorithms, which can discard measurements that appear to be very poor.

The combination of position estimation data is referred to as averaging in the position domain. Better performance is possible by combining various times-of-arrival (TOA), or pseudorange, measurements themselves from several successive time periods. This is called averaging in the measurement domain. The position is then calculated by combining pseudoranges that are computed both from different GPS signals and at a multiplicity of times. Various popular algorithms, such as LMS and Kalman filtering algorithms, may be used in averaging in the measurement domain.

In some cases, a prediction of a current value of the parameter from prior measurements may indicate that a current measurement is very poor or spurious. In this case the current measurement may be deleted in favor of such a prediction. Thus, it will be understood that combining a set of measurements may include the operation of deleting a current measurement in favor of prior measurements.

Figure 9:
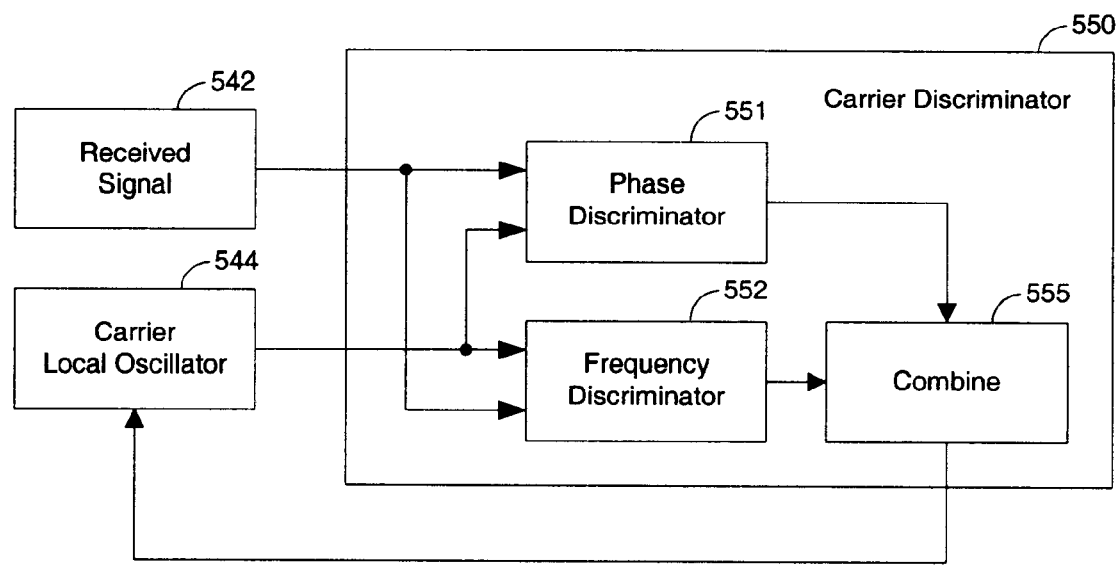
FIG. 9 shows a block diagram of a closed loop carrier tracking method according to one embodiment of the prior art.

FIG. 9 shows a block diagram of a closed loop carrier tracking method according to one embodiment of the prior art. In FIG. 9, a carrier discriminator 550 compares received signal 542 to a reference signal generated by an oscillator 544. Carrier discriminator 550 comprises a phase discriminator 551 and a frequency discriminator 552. Phase discriminator 551 generates a correction signal to reduce the phase difference between the received signal and the local carrier signal. Similarly, frequency discriminator 552 generates a correction signal to reduce the frequency difference between the received signal and the local carrier signal. Since frequency is the time derivative of phase, the correction signals from the phase discriminator and the frequency discriminator may be combined to adjust the oscillator 544 in order to generate a local carrier signal that has the same phase and frequency of the received signal.

Figure 10:
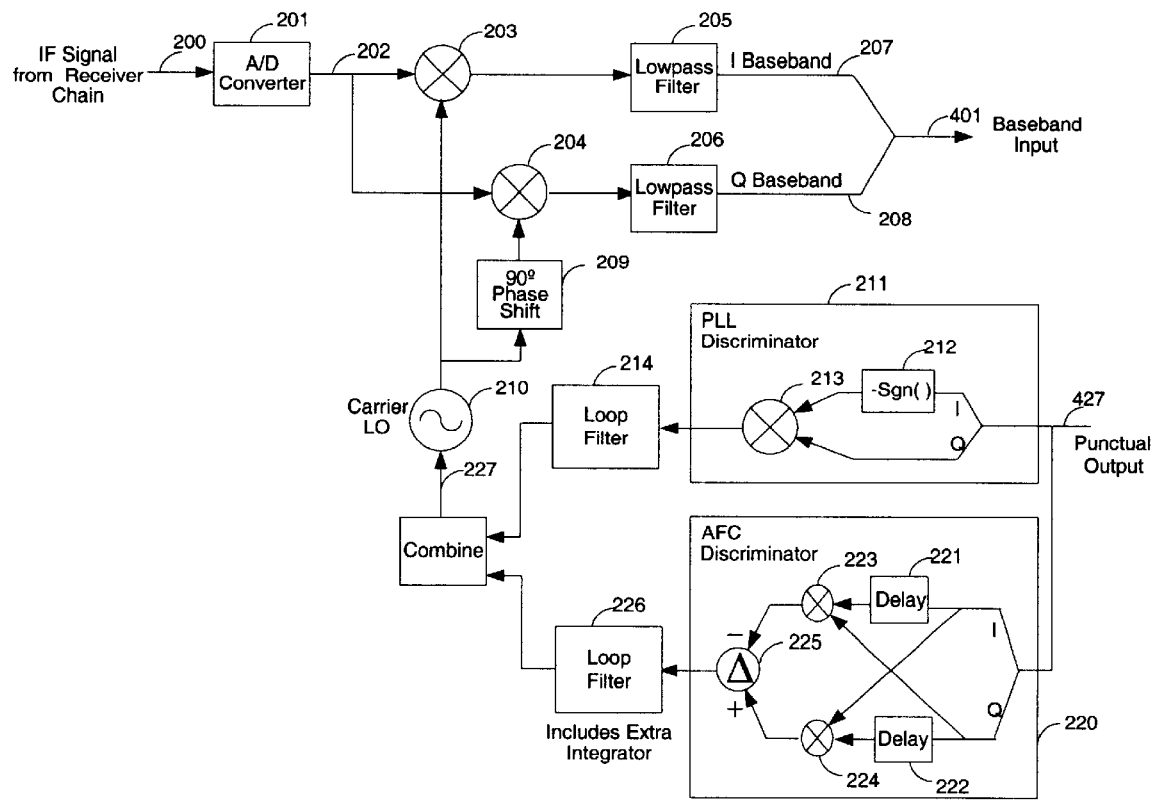
FIG. 10 shows a detailed closed loop carrier tracking method according to one embodiment of the prior art.

FIG. 10 shows a detailed closed loop carrier tracking method according to one embodiment of the prior art. A carrier tracking circuit according to the method in FIG. 10 is typically combined with a PN tracking circuit according to the method in FIG. 3. Typically, the signal on line 401 in FIG. 10 is sent, as the baseband input, into line 401 in FIG. 3 for tracking PN sequence, and the punctual output on line 427 in FIG. 3 is sent into line 427 in FIG. 10 for the generation of a carrier correction signal.

To provide the baseband input on line 401 in FIG. 10, the Intermediate Frequency (IF) signal received on line 200 is digitized by an Analog to Digital (A/D) converter 201 and is passed through the I/Q downconverter, which comprises multipliers 203 and 204 and lowpass filters 205 and 206. Phase Lock Loop (PLL) discriminator 211 and Automatic Frequency Control (AFC) discriminator 220 use the punctual output on line 427, which is the de-spread signal of the baseband input, to generate a carrier correction signal. Loop filters 214 and 226 adjust the rate and amplitude of the correction signals before the correction signals are combined into the signal on line 227 to adjust the carrier local oscillator 210 in order to replicate the carrier term $\cos[2\pi f_0 (t-\tau)+\theta_r]$ of equation (1).

When the oscillator 210 is adjusted to replicate exactly the term $\cos[2\pi f_0(t-\tau)+\theta_r]$, the I baseband signal on line 207 contains a GPS baseband signal, and the Q baseband signal on line 208 does not contain any GPS baseband signal. Corresponding to the phase discriminator 551, PLL discriminator 211 measures the instantaneous phase difference between the carrier of the received signal on line 202 and the output of the oscillator 210. Corresponding to the frequency discriminator 552, AFC discriminator 223 measures the instantaneous frequency difference.

Some implementations of GPS receivers utilize only a PLL discriminator, others utilize only an AFC discriminator, and others use a combination of both, either concurrently or at different instances in time. A feedback loop utilizing a PLL discriminator is typically more sensitive than is one using an AFC discriminator; however, a PLL discriminator based loop is more susceptible to transients caused by platform dynamics. Hence, the choice of the best approach depends upon signal strength and dynamics. Many receivers utilize both types of discriminators and adapt their usage to varying signal conditions.

A closed carrier tracking loop as in FIG. 10 performs poorly when the signal becomes too weak or the carrier phase parameter changes too rapidly. In these cases an error of 180 degrees often results since the discriminators are unable to distinguish phase errors that are multiples of 180 degrees. These types of errors are called "cycle slips" and are common in closed carrier tracking loops when the signal conditions are poor.

Some embodiments of the present invention seek to use open carrier tracking loops to measure the frequency and/or the phase of the carrier. A de-spread signal, which is typically provided by the punctual output on line 427, is analyzed to obtain the measurements without the necessity to generate a reference carrier of the same frequency and the same phase as those of the received signal. Thus, the deleterious effects of closed loop tracking systems can be avoided. A variety of methods will be disclosed for such open loop frequency/phase measurements, including (A) a frequency doubler based method, (B) a frequency discriminator based method, (C) a block phase estimator based method, and (D) a channelized filter based method. These will now be described.

Open loop carrier frequency tracking methods, according to the present invention, directly measures the carrier frequency from a de-spread signal from a PN tracking circuit. After the pseudonoise is removed from the baseband input, the de-spread signal in the punctual output is in the form:

$$s_1(t)=Ad(t-\tau)\exp(j2\pi f_e t+j\theta_t) \qquad (6)$$

where the frequency $f_e$ is the residual carrier frequency of the de-spread signal after the Doppler removal operation typically performed by mixers 203 and 204 and lowpass filters 205 and 206 of FIG. 10. For simplicity the constant phase term corresponding to the term $-2\pi f_0\tau$ in equation (1) is incorporated into $\theta_r$.

Figure 11:
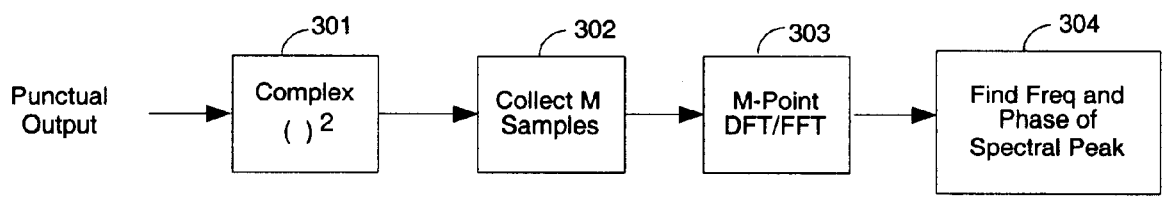
FIG. 11 shows an open loop carrier frequency measurement method, based on a frequency doubler, according to one embodiment of the present invention.

FIG. 11 shows an open loop carrier frequency measurement method, based on a frequency doubler, according to one embodiment of the present invention. The punctual output signal is squared in operation 301, which produces a nearly unmodulated sinusoidal signal:

$$s_2(t)=A^2 \exp(j4\pi f_e t+j2\theta_t) \qquad (7)$$

since $d^2=1$. M samples of this sinusoidal signal are collected in operation 302 and are analyzed in operation 303, by a Fast Fourier Transform (FFT) method or a Discrete Fourier Transform (DFT) method, to produce a spectral output. Operation 304 finds the peak of the spectral output, which corresponds to the frequency and the phase of the signal in equation (7), i.e., $2f_e$ and $2\theta_r$. Thus, a divide by two operation is needed to produce the frequency $f_e$ and the phase $\theta_r$. High in measurement precision, this approach is computationally intensive and is slightly less sensitive than other methods, such as that of FIG. 14.

Figure 12:
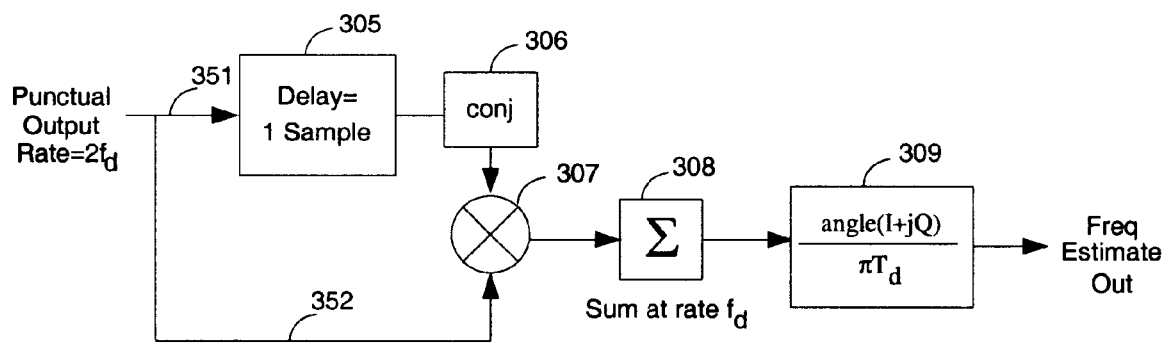
FIG. 12 shows another open loop carrier frequency measurement method, based on a frequency discriminator, according to one embodiment of the present invention.

FIG. 12 shows another open loop carrier frequency measurement method, based on a frequency discriminator, according to one embodiment of the present invention. The frequency discriminator comprises delay operator 305, conjugating operator 306 and multiplier 307. Suppose the input is sampled from the punctual output at a rate that is two samples per BPSK data bit period $T_d$, and the multiplier 307 produces output at a rate equal to the data rate (i.e., at 50 baud). For samples that occur within the same bit period, the multiplier 307 produces $$s_3(t)=A^2 \exp(j2\pi f_e T_d/2+j(\theta_t-\theta_{t-T_d/2})) \quad (8)$$

since $d(t-\tau)\ d(t-\tau-T_d/2)=1$. Assuming that the residual phase modulation is negligible, i.e., $(\theta_t-\theta_{t-T_d/2})=0$, the phase angle of $s_3(t)$ is proportional to the residual carrier frequency. Thus, $f_e$ can be obtained by dividing the phase angle of $s_3(t)$ by $\pi T_d$. The averaging process of 308 is used to improve the signal-to-noise ratio.

The frequency discriminator based loop is fairly sensitive and quite simple to implement, but it is not as accurate as the frequency doubler based loop as shown in FIG. 11.

It is also possible to perform the same operation where the input sampled from the punctual output occurs at a different rate other than twice the BPSK data rate, e.g., at 1 kHz. When the input sampled from the punctual output occurs at a rate such that a one-sample delay caused by operation 305 is $T_c$, the residual carrier frequency $f_e$ can be obtained by dividing the phase angle by $\pi T_c$. However, the sensitivity is reduced since the Signal-to-Noise Ratio (SNR) per punctual sample is reduced when the integration time per punctual sample is reduced. It can be seen that the conjugating operator 306 may be applied on the signal on line 352 instead of the signal on line 351. Also, various other multiplication structures may be used in substitution for the four-quadrant multiplier of 307.

Figure 13:
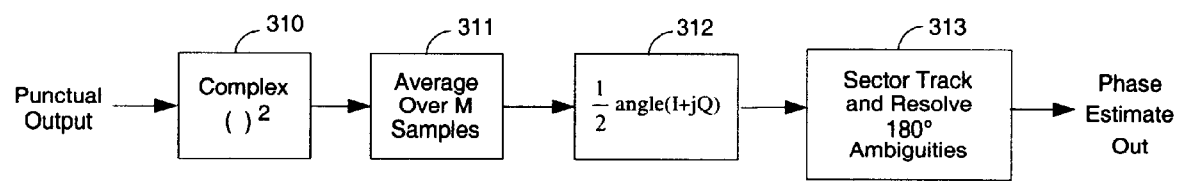
FIG. 13 shows another open loop carrier frequency measurement method, based on a block phase estimator, according to one embodiment of the present invention.

FIG. 13 shows another open loop carrier frequency measurement method, based on a block phase estimator, according to one embodiment of the present invention. Operation 310 squares the punctual output to produce a signal in equation (7). The average of this signal over an interval of length D centered at time $t_0$, i.e.

$(t_0-D/2, t_0+D/2)$, is $$s_4(t)=A^2 \exp(j4\pi f_e t_0+j2\theta_{t_0})\sin c(2f_e D) \quad (9)$$

where $\sin c(x)=[\sin(\pi x)]/(\pi x)$ and we assume that $\theta_t$ changes negligibly over the range $(t_0-D/2, t_0+D/2)$. Operation 312 measures the one-half angle of $s_4$, i.e. $2\pi f_e t_0+\theta_{t_0}$. Notice that this is the same as the phase angle of (6) measured at time $t_0$. When $\theta_t$ is not constant, this process produces a good estimate of the average of $2\pi f_e t_0+\theta_t$ over the interval D, as long as $\theta_t$ is not changing too rapidly over this interval. The averaging process of 311 is used to improve the signal-to-noise ratio.

Since the phase angle of $s_4$, say $\phi_t$, is in the range $[0, 2\pi]$, the half angle produced by 312, say $\eta_t$, is actually ambiguous, that is it may equal $\frac{1}{2} \phi_t+n\pi$, where n can be 0, or 1. Thus, there is an ambiguity in determining the phase angle as a function of time. This ambiguity may be resolved by tracking the trajectory of $\phi_t$. The quantity $\pi$ is added to the phase angle $\eta_t$ when $\phi_t$ passes through 0 degrees in the positive direction; and the quantity $\pi$ is subtracted from the phase angle when $\phi_t$ passes through 0 degrees in the negative direction. Operation 313 carries out this operation, which is called "sector tracking".

There are several variations of the method in FIG. 13. The operation 310 may have a nonlinearity for the amplitude portion of the signal to produce the signal $A_r \exp(j4\pi f_e t+ j2\theta_t)$, $r\geq 0$. The general approach remains the same. For example, instead of the squaring operation shown in FIG. 13, the signal samples may be converted into a polar coordinate representation, consisting of amplitude and phase elements. One doubles the resulting phase elements, modulo $2\pi$, to effectively square the phase portion of the signal. The amplitude term may be kept the same or raised to a small power (e.g., between 0 and 2). The signal may then be converted back to a rectangular coordinate system to facilitate the subsequent averaging.

The above process provides an estimate of the phase angle $2\pi f_e t_0+\theta_{t_0}$. By making a succession of such measurements, the frequency $f_e$ may be ascertained. For example, if another measurement is taken at time $t_1$ one would obtain the phase angle $2\pi f_e t_1+\theta_{t_1}$. If $\theta_t$ changes little from $t_0$ to $t_1$ then the difference phase angles is seen to be $2\pi f_e(t_1-t_0)$ and since $(t_1-t_0)$ is known, the quantity $f_e$ is easily calculated.

Figure 14:
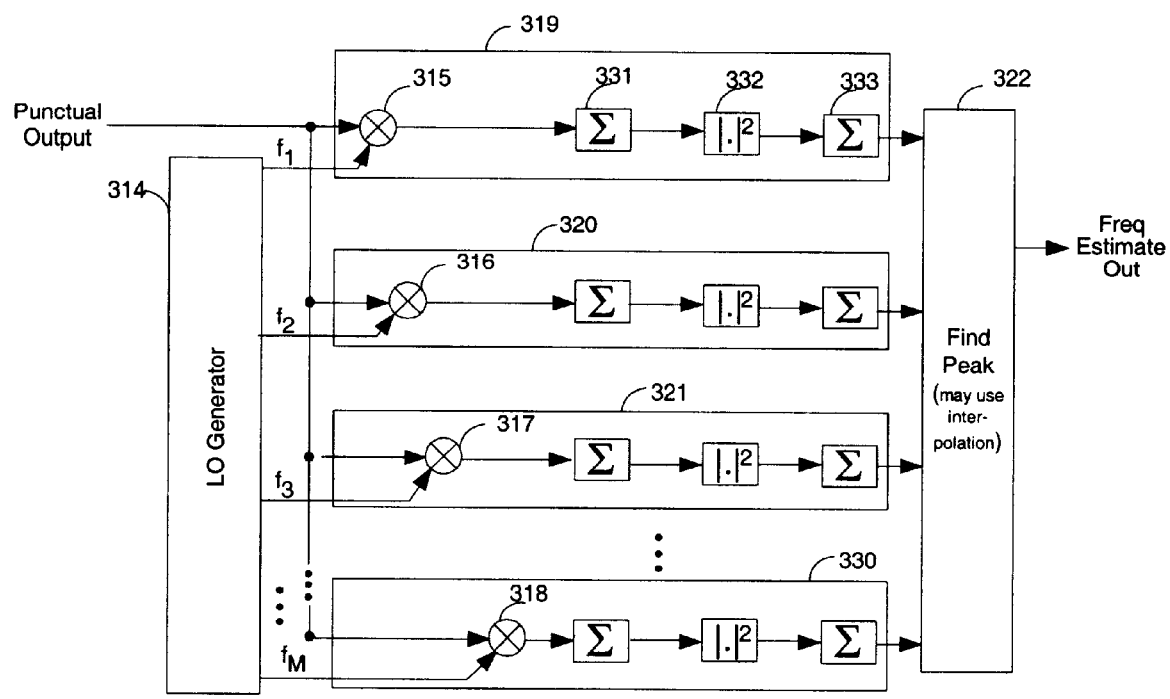
FIG. 14 shows another open loop carrier frequency measurement method, based on a channelized filter, according to one embodiment of the present invention.

FIG. 14 shows another open loop carrier frequency measurement method, based on a channelized filter, according to one embodiment of the present invention. The local oscillator (LO) 314 generates a set of reference carrier signals of different frequencies (i.e., $f_1, f_2, \ldots, f_M$) that are provided to a set of frequency channelizers. Each channelizer produces an output that quantifies the degree of agreement between the frequency of the LO provided to it and the carrier frequency of the signal in the punctual output. For example, frequency channelizer 319, comprising multiplier 315, accumulator 331, nonlinear detector 332, and accumulator 333, measures the degree of agreement between $f_1$ and the carrier frequency of the punctual output signal. The frequency of the channel that provides the maximum output is a coarse estimate of the carrier frequency of the punctual output signal. Peak finder 322 interpolates the output of the channelizers 319, 320, 321, . . . , 330 to compute a more accurate measurement of the frequency of the punctual output signal. In many cases the computed measurement is 10 times more accurate than the coarse estimate (i.e., the frequency of the channel providing the maximum output). In some cases a single output from each detector suffices, and the function of the accumulators after the detectors (e.g., accumulator 333) can be deactivated.

Once the PN component of the signal in equation (1) is removed, the punctual signal is in the form of equation (6) (i.e., $A\ d(t-\tau)\exp(j2\pi f_e t+j\theta_t)$). This signal is multiplied by a local reference signal $\exp(-j2\pi f_m t)$ by multiplier 315 to produce the signal $$s_5(t)=Ad(t-\tau)\exp(j2\pi(f_e-f_m)t+j\theta_t)=Ad(t-\tau)\exp(j2\pi t\delta+j\theta_t) \quad (10)$$

where $\delta=f_e-f_m$. If the accumulator 331 sums over a period of time T, which is less than or equal to a bit period (but not across bit boundaries), then the output of the non-linear detector 332 may be approximated as an integral $$s_6(t) = \frac{1}{T} \left| \int_{t-T/2}^{t+T/2} Ad(x-\tau)\exp(j2\pi x\delta + j\theta_t)dx \right|^2 = A^2\text{sinc}^2(T\delta) \quad (11)$$

where $\theta_t$ is assumed to be a constant (or to be varying slowly with time). This function is maximized when $\delta=0$, that is when $f_m=f_e$.

The channelizers produce samples of the output of the function in equation (11) for different values of $\delta$, corresponding to the different values of frequencies of the channelizers (e.g., $f_1, f_2, \ldots$) When these samples of the function in equation (11) are close enough in frequency (e.g., within 0.5/T), these samples may be used in an interpolation procedure to estimate the location of the peak of the function in equation (11), which in the absence of noise is located at $f_m=f_e$. Even if these samples are more widely spaced than 0.5/T, it is still possible to perform an interpolation upon the function in equation (11) since the functional form is known. A method of performing such an interpolation is to utilize 3 or more channelizer outputs in a curve fit using a spline (or other types of polynomials). Due to the specific nature of the function in equation (11), it is possible to perform the final interpolation using the outputs from only two such channelizers. However, more than two channelizers are required to first determine which two channelizers straddle the location of the peak. Once this is determined, these two channelizer outputs may be used in a final interpolation process to compute the location of the peak to determine $f_e$. Thus, considered as a whole, such an interpolation algorithm does require at least three channelizers.

The channelized approach is very sensitive, but not as accurate as the frequency doubler and spectral analysis approach. However, it is simple to implement, especially when the number of channels is small.

In FIG. 14, each channelizer (e.g., channelizer 319) may be viewed as a correlation indicator generator. For example, the punctual output is fed to multiplier 315, accumulator 331, nonlinear detector 332, and accumulator 333. The output of accumulator 333 may be viewed as the output of a correlation operation. These processing steps are the same as the correlation operation performed in FIG. 8 by blocks: multiplier 105, accumulator 106, nonlinear detector 107, and accumulator 120. Another way to view the frequency channelizer is as a spectrum analyzer, but without the preceding nonlinearity of the frequency doubler of FIG. 11. Each channel of the channelizer may be viewed as producing a separate spectral component corresponding to the frequency provided by the LO generator 314. The magnitude and squaring operation of 332 is typically used in a spectrum analyzer. The postdetection integration of 333 is used to provide an improved estimate of the energy associated with the particular spectral line. Since the integration time associated with 331 is typically limited to that of the data bit periods, the frequency precision of the channelizer approach is typically much poorer than that of the squaring and spectrum analysis approach of FIG. 11. It is possible to utilize FFT or DFT algorithms to perform the functions of the LO generation 314, and the initial multiplication and summation of each of the channelizers of FIG. 14.

The various methods in FIGS. 11–14 may be used to estimate carrier phase and/or frequency. Successive estimates may be utilized in a tracking procedure for GPS signals that aids in the continued processing of such signals. Typically, it is the case that a prior estimate of frequency is used to adjust a parameter estimation window to be used for additional estimates performed as a part of an overall tracking procedure. The adjustment typically takes the form of the window center adjustment and/or the window width adjustment. Succeeding frequency estimation operations then utilize the window to constrain the acceptable range of search for valid frequency estimates. Alternatively, the window may be used as at least one validity criterion to either accept or discard a measurement. The use of such a window aids to reduce the amount of computation required, as well as reduces the occurrences of false answers. The maximum window adjustments are typically based upon a priori knowledge, dictated by physical principles, such that a particular parameter cannot change more than a prescribed amount from one measurement time to the next It should be appreciated that although the block diagrams of FIGS. 11–14 may imply a hardware implementation, it is often practical to implement at least a portion of any of these methods using software based approaches, particularly when a microprocessor is employed that has good signal processing capability.

A variety of methods (e.g., matched filters, fast Fourier Transform, fast convolution methods, etc.) can be used to produce correlation indicators as discussed above. Some GPS signal processors utilize matched filters rather than serial correlators to perform PN acquisition and de-spreading operations. Such matched filters periodically produce, as outputs, values substantially identical to those that would be produced by a set of serial correlators. In particular, it is possible to produce early, late and punctual correlation outputs using matched filters instead of serial correlators. Hence, the previous discussion applies to situations in which matched filters are utilized instead of serial correlators. In addition, it is possible to perform matched filtering operations using fast Fourier transform (FFT), or other fast convolution methods (e.g., those described in U.S. Pat. No. 5,663,734). The present invention applies equally well to situations in which these alternative methods of matched filtering are employed to create the correlation indicators.

Figure 15:
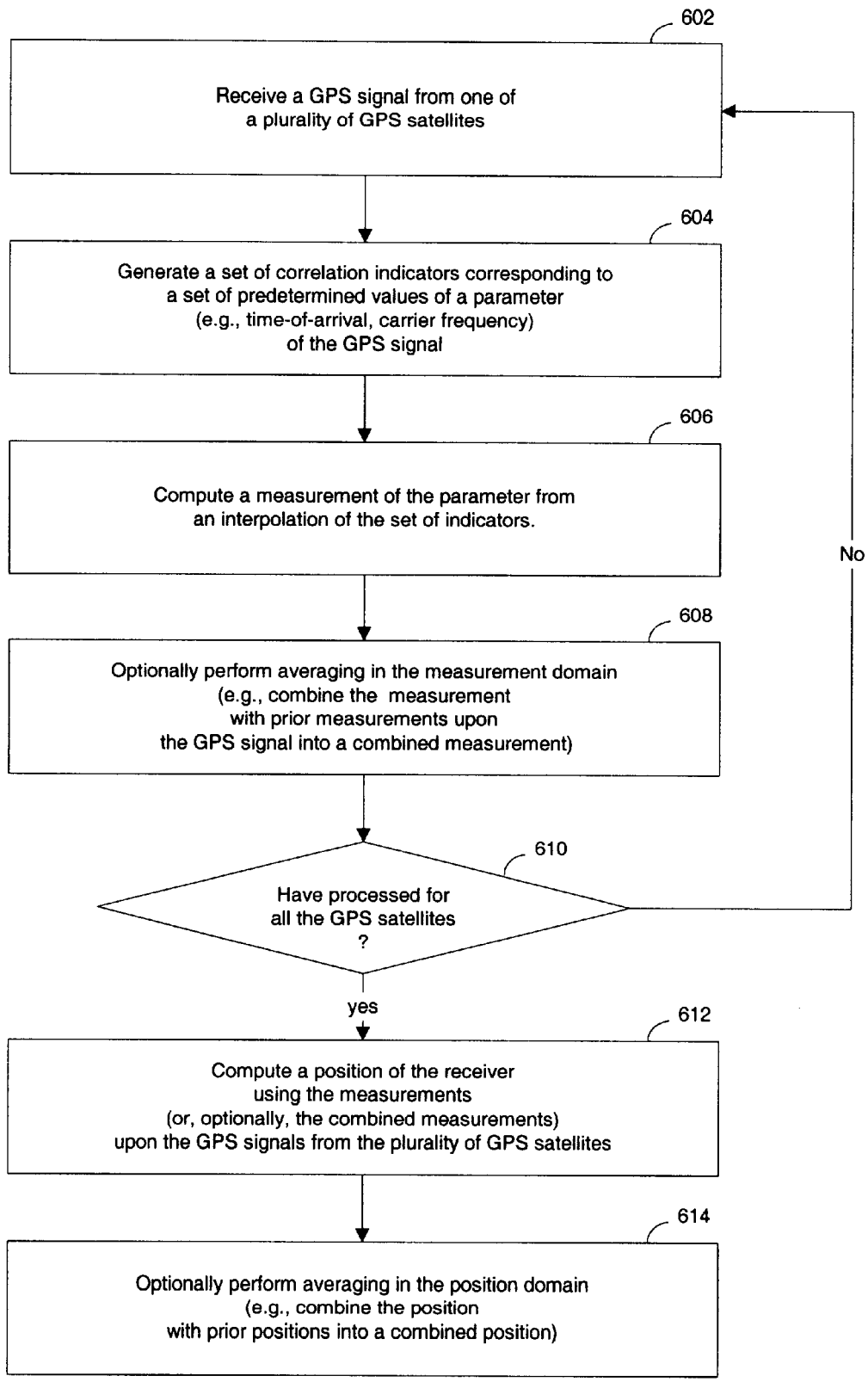
FIG. 15 shows a flow chart for open loop tracking satellite positioning system signals to determine a position of a receiver according to one embodiment of the present invention.

According to one embodiment of the present invention, FIG. 15 shows a flow chart for open loop tracking satellite positioning system signals to determine a position of a receiver. After a GPS signal is received from one of a plurality of GPS satellites in operation 602, a set of correlation indicators can be generated in operation 604 for a set of predetermined values of a parameter (e.g., time-of-arrival or carrier frequency) of the GPS signal. From an interpolation of the set of indicators, a measurement is obtained in operation 606. Optionally, averaging in measurement domain can be performed in operation 608 to combine the measurement with prior measurements for the GPS signal into a combined measurement. Various methods, such as least-mean-square filtering, Kalman, filtering, median filtering, can be used to combine the measurements. Operations 602–608 are repeated for GPS signals from each of the plurality of GPS satellites. It should be appreciated that operations 602–608 can be performed in sequence or in parallel for each of the GPS satellites. When the GPS signals for all the satellites are processed, as determined in operation 610, a position of the receiver is obtained in operation 612 from the individual or combined measurements for the GPS signals corresponding to the plurality of GPS satellites. Optionally, averaging in the position domain can be performed in operation 614.

Figure 16:
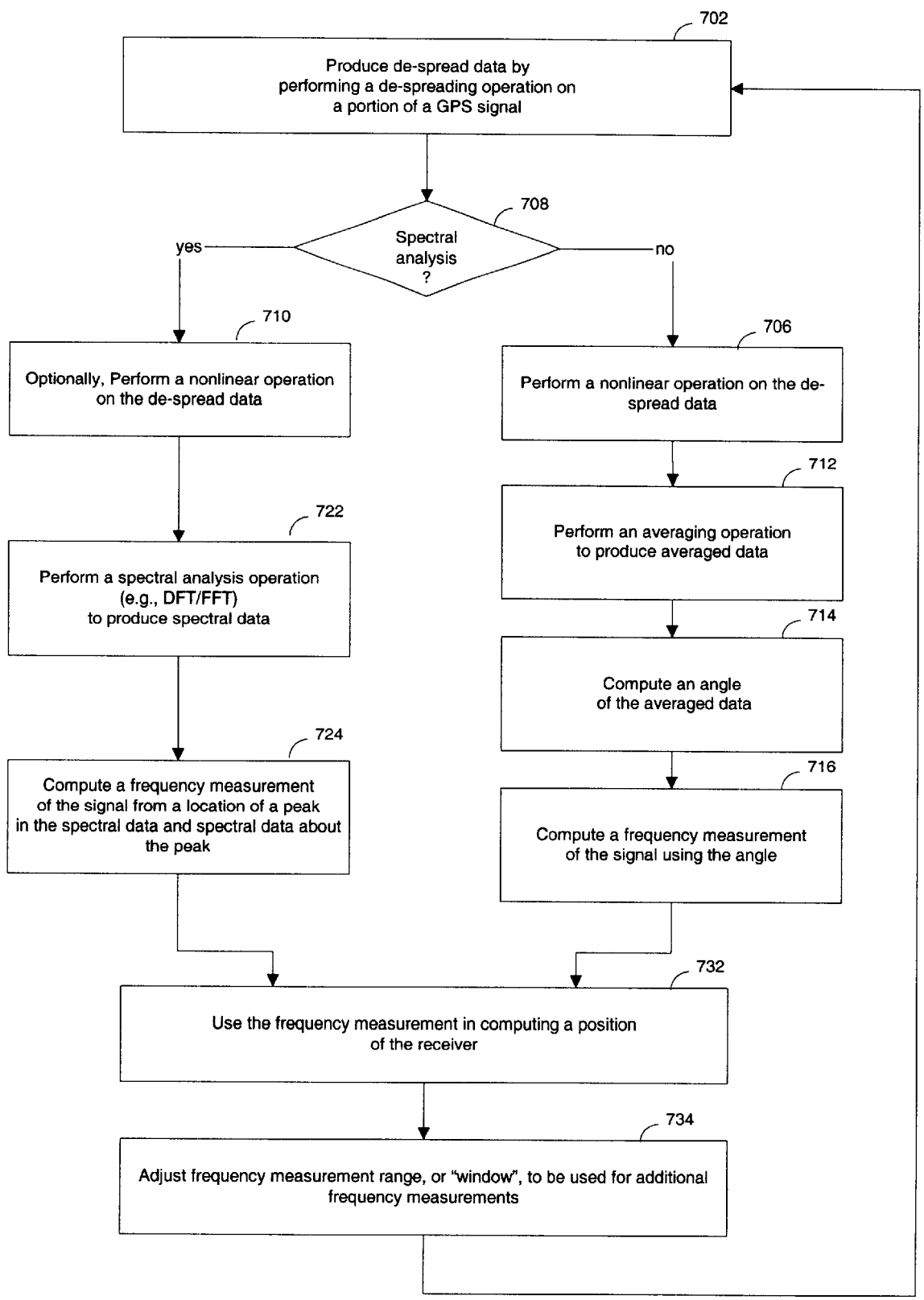
FIG. 16 shows a flow chart for open loop carrier frequency tracking according to some embodiments of the present invention.

According to some embodiments of the present invention, FIG. 16 shows a flow chart for open loop tracking carrier frequency. Operation 702 performs a de-spreading operation on a portion of a GPS signal to produce de-spread data. The de-spreading operation can be performed using serial correlators or matched filters. Next a decision is made in 708 whether spectral analysis is to be performed. If a spectral analysis operation is used then a preceding nonlinear operation of 710 may optionally be employed. For example, such a nonlinear operation is used for the frequency doubler/ spectrum analysis approach of FIG. 11. The nonlinearity is not used if the channelized filter approach of FIG. 14 is used (as mentioned earlier, FIG. 14 is a form of spectral analysis). When a spectral analysis is used, operation 722 produces spectral data using Discrete Fourier Transformation (DFT) or Fast Fourier Transformation (FFT). From the peak location of the spectral data plus the magnitude of the spectral data in the vicinity of the peak, a measurement of the carrier frequency of the GPS signal is determined in 724. Finally, the frequency measurement is used in operation 732 to determine the position of the receiver.

If a spectral analysis is not used as determined by decision 708, then a nonlinear operation (e.g., a squaring operation, or a delay, conjugating and multiplication operation as shown in FIG. 12) is always used on the de-spread data. Next an averaging operation is performed in 712 to produce averaged data. Operation 712 is generally used to improve the signal-to-noise ratio. The phase angle of the averaged data is computed in operation 714. In operation 716, a measurement of the carrier frequency of the GPS signal is computed using the phase angle obtained in operation 714. For example, the operations 712 through 716 are illustrated in both the frequency discriminator of FIG. 12 and the block phase estimator of FIG. 13. Regardless of which frequency measurement method is used, the operation of block 734 is a controlling step in which the results of the past frequency measurement is used (perhaps in conjunction with prior measurements) in order to adjust a frequency measurement range, or window. This window may be used in performing subsequent frequency measurements by serving to constrain the range over which processing is performed, or provide a range over which a future frequency estimate is considered valid.

Figure 17:
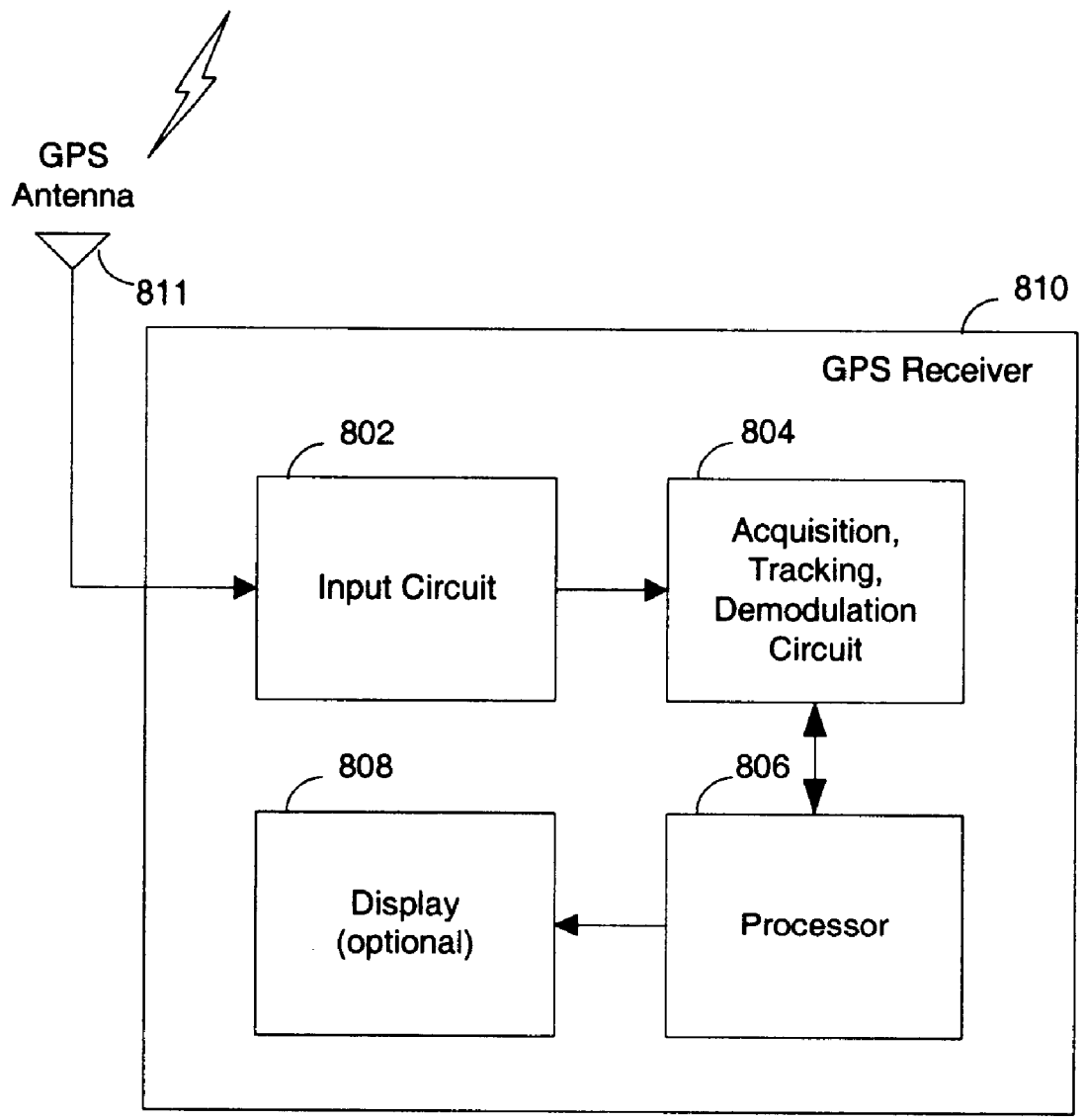
FIG. 17 shows a block diagram representation of a receiver which implements the open loop tracking methods according to the present invention.

FIG. 17 shows a block diagram representation of a receiver that implements the open loop tracking methods according to the present invention. Input circuit 802 is coupled to GPS antenna 811 to receive GPS signals from a plurality of satellites. Circuit 804 is couple to the processor 806 to acquire, track, demodulate the GPS signal. Various methods of the present invention can be implemented in 804 and 806 (using hardware, or software, or a combination of hardware and software) to compute measurements of the parameters of GPS signals from a plurality of satellites. The processor 806 computes the position of the receiver using these measurements. An optional display device 808 is coupled to the processor 806 to show the position of the receiver.

Figure 18:
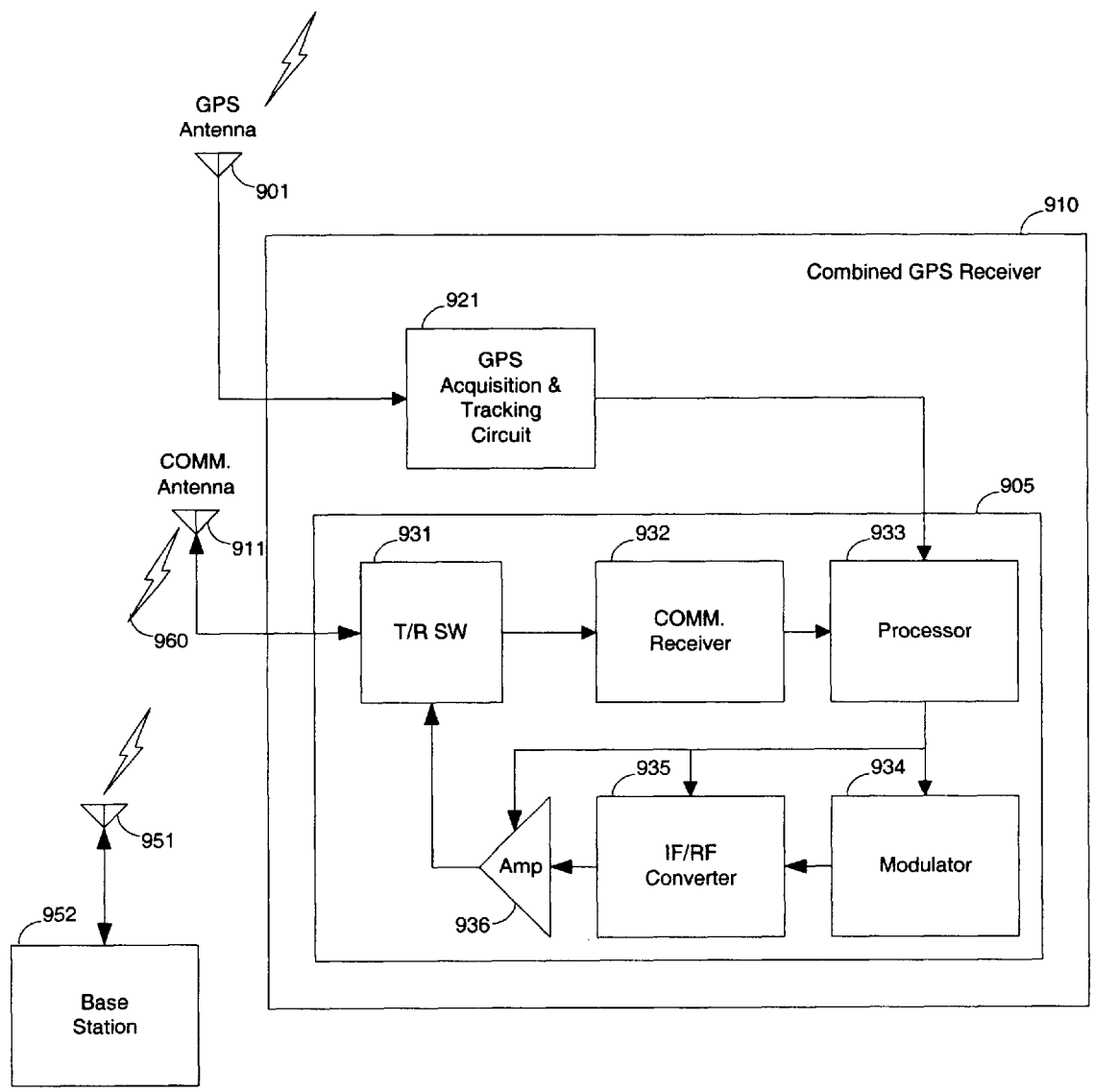
FIG. 18 shows a block diagram representation of a remote satellite positioning system which implements the open loop tracking methods according to the present invention.

FIG. 18 shows a block diagram representation of a remote satellite positioning system which implements the open loop tracking methods according to the present invention. The remote satellite positioning system comprises a portable receiver, which combines a communication transceiver with GPS receiver for use in one embodiment of the present invention. The combined mobile unit 910 includes circuitry for performing the functions required for processing GPS signals as well as the functions required for processing communication signals received through a communication link. The communication link, such as communication link 960, is typically a radio frequency communication link to another component, such as a base station 952 having a communication antenna 951.

Portable receiver 910 is a combined GPS receiver and a communication receiver and transmitter. Receiver 910 contains a GPS receiver stage including acquisition and tracking circuit 921 and communication transceiver section 905. Acquisition and tracking circuit 921 is coupled to GPS antenna 901, and communication transceiver 905 is coupled to communication antenna 911. GPS signals are received through GPS antenna 901 and input to acquisition and tracking circuit 921 which acquires the PN codes for the various received satellites. The data produced by circuit 921 (e.g., correlation indicators) are processed by processor 933 for transmittal by transceiver 905. Communication transceiver 905 contains a transmit/receive switch 931 which routes communication signals (typically RF) to and from communication antenna 911 and transceiver 905. In some systems, a band splitting filter, or "duplexer," is used instead of the T/R switch. Received communication signals are input to communication receiver 932 and passed to processor 933 for processing. Communication signals to be transmitted from processor 933 are propagated to modulator 934 and frequency converter 935. Power amplifier 936 increases the gain of the signal to an appropriate level for transmission to base station 952.

In one embodiment of the combined GPS/communication system of receiver 910, data generated by acquisition and tracking circuit 921 is transmitted over communication link 960 to base station 952. Base station 952 then determines the location of receiver 910 based on the data from the remote receiver, the time at which the data were measured, and ephemeris data received from its own GPS receiver or other sources of such data. The location data can then be transmitted back to GPS receiver 910 or to other remote locations. The communication link 960 between receiver 910 and base station 952 may be implemented in a number of various embodiments including a direct link or cellular telephone link. More details about portable receivers utilizing a communication link are disclosed in commonly assigned U.S. Pat. No. 5,874,914 (Krasner), the complete disclosure of which is hereby incorporated by reference.

The prior discussion focuses separately on determining code phase with an open loop approach and determining frequency with an open loop approach. It should be appreciated that the two approaches might be utilized individually or together. For example, a set of correlator may be assigned to cover simultaneously a range of code phases and a range of frequencies (using, for example, a channelized approach of FIG. 14). Alternatively, open loop frequency tracking approach may be performed after the code phase is tracked and determined with a relatively coarse initial estimation of the carrier frequency. Such an approach might tradeoff complexity for time to commence the full tracking operation.

Open loop carrier tracking may also be employed to improve the performance of either open loop or closed loop code phase tracking. It is well-known that carrier tracking may be advantageously used to estimate the velocity of a platform, which in turn may be employed to estimate the rate of change of the PN code phases. For example, in one approach, carrier frequency tracking is used for so-called "code-carrier smoothing" in which successive estimates of PN code phases are filtered through use of a filter whose parameters are determined by the carrier frequency estimates. The reasons why this works well is that the carrier frequency is much higher than that of the PN code (1540 times larger for the U.S. GPS system) and hence a rate-of-change derived from the carrier is much more accurate than one derived from the PN code (1540 times more accurate for U.S. GPS).

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal), typically modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolites or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should be evident, however, that these methods are equally applicable to similar satellite positioning systems, and in particular, the Russian Glonass system and the proposed European Galileo System. The Glonass system primarily differs from GPS system in that the emissions from different satellites are differentiated from one another by utilizing slightly different carrier frequencies, rather than utilizing different pseudorandom codes. In this situation substantially all the circuitry and algorithms described previously are applicable. The term "GPS" used herein includes such alternative satellite positioning systems, including the Russian Glonass system.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of processing satellite positioning system signals, the method comprising:

generating a set of at least three indicators based on processing a portion of a satellite positioning system signal received by a receiver, each of the indicators being indicative of a probability that a parameter of the signal is equal to a predetermined value; and computing a measurement of the parameter from an interpolation of the set of indicators.

2. A method as in claim 1 wherein the parameter is one of:

(a) time-of-arrival, and
    (b) carrier frequency.

3. A method as in claim 1 wherein one of the indicators is generated by one of:

(a) serial correlation,
    (b) matched filtering,
    (c) fast Fourier transformation, and
    (d) fast convolution.

4. A method as in claim 1 further comprising:
    computing a position using the measurement.

5. A method as in claim 1 further comprising:
    computing a position using the measurement and one or more prior measurements.

6. A method as in claim 1 further comprising:
    combining the measurement with one or more prior measurements into a combined measurement.

7. A method as in claim 6 wherein the combining comprises one of:

(a) least-mean-square filtering,
    (b) Kalman filtering, and
    (c) median filtering.

8. A method as in claim 4 further comprising:
    combining the position with one or more prior positions into a combined position.

9. A method as in claim 8 wherein the combining comprises one of:

(a) least-mean-square filtering,
    (b) Kalman filtering, and
    (c) median filtering.

10. A method of processing satellite positioning system signals, the method comprising:

receiving a set of at least three indicators based on a portion of a satellite positioning system signal received by a receiver, each of the indicators being indicative of a probability that a parameter of the signal is equal to a predetermined value; and computing a measurement of the parameter from an interpolation of the set of indicators.

11. A receiver of satellite positioning system signals, the receiver comprising:

first circuitry configured to be coupled to an antenna to receive a satellite positioning system signal; and second circuitry coupled to the first circuitry, the second circuitry configured to generate a set of at least three indicators based on processing the portion of the satellite positioning system signal received by the first circuitry, each of the indicators being indicative of a probability that a parameter of the signal is equal to a predetermined value, the second circuitry configured to compute a measurement of the parameter from an interpolation of the set of indicators.

12. A receiver as in claim 11 wherein the first circuitry and the second circuitry comprise a single integrated circuit.

13. A receiver as in claim 11 wherein the second circuitry comprises:

memory configured to store the indicators; and a programmable digital signal processor coupled to the memory, the programmable digital signal processor configured to generate the indicators and to compute the measurement.

14. A receiver as in claim 11 wherein the parameter is at least one of:

(a) time-of-arrival, and
    (b) carrier frequency.

15. A receiver as in claim 11 wherein the second circuitry is configured to generate at least one of the indicators using one of:

(a) serial correlation,
    (b) matched filtering,
    (c) fast Fourier transform, and
    (d) fast convolution.

16. A receiver as in claim 11 wherein the second circuitry is configured to compute a position using the measurement.

17. A receiver as in claim 11 wherein the second circuitry is configured to compute a position using the measurement and one or more prior measurements.

18. A receiver as in claim 11 wherein the second circuitry is configured to combine the measurement with one or more prior measurements into a combined measurement.

19. A receiver as in claim 17 wherein the second circuitry is configured to combine the position with one or more prior positions into a combined position.

20. A receiver of satellite positioning system signals, the receiver comprising:

first circuitry configured to be coupled to an antenna to receive a satellite positioning system signal;

second circuitry coupled to the first circuitry, the second circuitry configured to generate a set of at least three indicators based on processing the portion of the satellite positioning system signal received by the first circuitry, each of the indicators being indicative of a probability that a parameter of the signal is equal to a predetermined value; and a third circuitry coupled to the second circuitry, the third circuitry configured to be coupled to an antenna to communicate the set of indicators received from the second circuitry to a base station.

21. A base station of processing satellite positioning system related signals, the base station comprising:

first circuitry configured to be coupled to an antenna to receive a set of at least three indicators from a receiver of satellite positioning system signals, each of the indicators being indicative of a probability that a parameter of a satellite positioning system signal is equal to a predetermined value; and second circuitry coupled to the first circuitry, the second circuitry configured to compute a measurement of the parameter from an interpolation of the set of indicators.

22. A machine readable media containing executable instructions which when executed by a receiver of satellite positioning system signals cause the receiver to perform a method comprising:

generating a set of at least three indicators based on a portion of a satellite positioning system signal received by the receiver, each of the indicators being indicative of a probability that a parameter of the signal is equal to a predetermined value; and computing a measurement of the parameter from an interpolation of the set of indicators.

* * * * *